United States Patent [19]

Greer et al.

[11] Patent Number: 6,117,759
[45] Date of Patent: *Sep. 12, 2000

[54] METHOD FOR MULTIPLEXED JOINING OF SOLDER BUMPS TO VARIOUS SUBSTRATES DURING ASSEMBLY OF AN INTEGRATED CIRCUIT PACKAGE

[75] Inventors: Stuart E. Greer; David Clegg, both of Austin; Terry Edward Burnette, New Braunfels, all of Tex.

[73] Assignee: Motorola Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/775,981

[22] Filed: Jan. 3, 1997

[51] Int. Cl.[7] .................... H01L 21/44; B23K 31/00; B23K 31/02
[52] U.S. Cl. .................. 438/616; 438/613; 438/615; 228/180.22
[58] Field of Search .................... 438/109, 119, 438/107, 108, 613, 615, 616; 257/772, 779; 228/180.22

[56] References Cited

U.S. PATENT DOCUMENTS

| | | | |
|---|---|---|---|
| 4,750,665 | 6/1988 | Falanga | 228/123 |
| 5,131,584 | 7/1992 | Boitel | 228/180.2 |
| 5,188,280 | 2/1993 | Nakao et al. | 228/123 |
| 5,658,827 | 8/1997 | Aulicino | 228/180.22 |
| 5,729,896 | 3/1998 | Dalal | 29/840 |

FOREIGN PATENT DOCUMENTS 0 592 022 A1  4/1994  European Pat. Off. ...... H01L 23/485

OTHER PUBLICATIONS

Tetsuo, "Manufacture of Semiconductor Device," Patent Abstracts of Japan, 1 pg.

Primary Examiner—Charles Bowers
Assistant Examiner—Nema Berezny
Attorney, Agent, or Firm—James L. Clingan, Jr.

[57] ABSTRACT

Multiplexed joining of solder bumps to various substrates for assembly of an integrated circuit package includes placing a semiconductor substrate (312) having solder bump structures (314) in contact with a ceramic substrate (320 having chip pads (322, 334), and placing this structure in contact with ball grid array spheres (352) in order to form a CBGA (360) in a single flow process. The method includes the steps of providing a semiconductor device having at least one first interconnect structure connected to a surface of the semiconductor device (501), and a substrate having a plurality of metallized pads (503); placing an at least one second interconnect structure in aligned contact with one or more of the plurality of metallized pads (505); placing the at least one first interconnect structure in aligned contact with one or more of the plurality of metallized pads (507); and simultaneously reflowing the at least one first interconnect structure and the at least one second interconnect structure such that the semiconductor device and at least one second interconnect structure are connected to the metallized pads of the substrate (509).

41 Claims, 4 Drawing Sheets

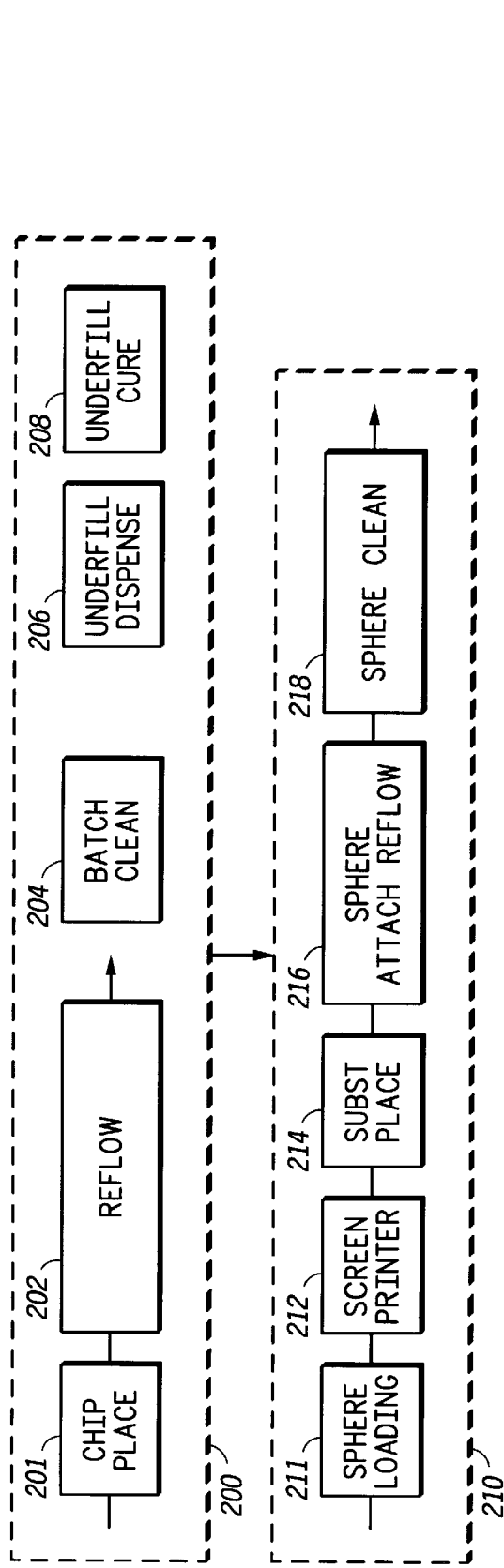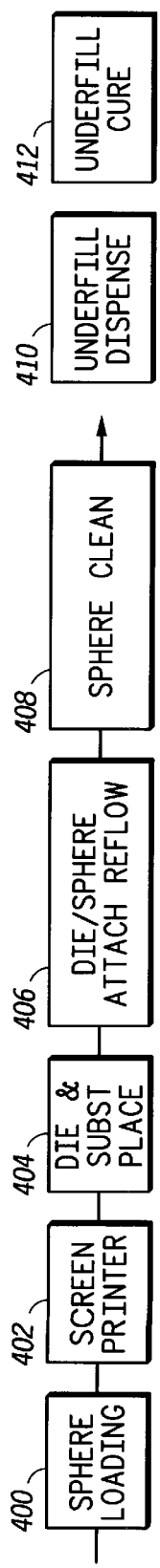

METHOD FOR MULTIPLEXED JOINING OF SOLDER BUMPS TO VARIOUS SUBSTRATES DURING ASSEMBLY OF AN INTEGRATED CIRCUIT PACKAGE

TECHNICAL FIELD

The present invention relates to the packaging of semiconductor devices. Specifically, the present invention relates to packaging semiconductor devices having solder bump structures attached to semiconductor substrates.

BACKGROUND

The current applications of semiconductor arts show the use of bumped solder interconnect structures, such as Controlled, Collapse Chip Connection (C4) technology as well as Evaporated, Extended Eutectic (E3), for connections to ceramic Ball Grid Arrays (BGAs). Ceramic BGAs (CBGAs) are known in the industry as an efficient apparatus for packaging semiconductor devices having large numbers of external interconnects such as input and outputs. FIG. 1 illustrates assembly of a CBGA. As illustrated in FIG. 1, a CBGA is formed by combining a ceramic substrate 120 and a semiconductor device 112 with solder interconnect structures 144, 162. The ceramic substrate 120 includes chip pads 122, which connect the ceramic substrate 120 to the semiconductor device/solder structure 110, and BGA pads 124, which connect the ceramic substrate 120 to BGA spheres 152 as illustrates in FIG. 1.

The chip pads 122 and BGA pads 124 are generally metallic and are electrically connected through the ceramic portion 121 by interconnect vias not (illustrated). The semiconductor device 110 comprises a semiconductor substrate 112 and bump solder structures 114. The bump solder structures 114 can have several different structural forms. One such structural form would be a Controlled, Collapse Chip Connection Technology (C4) bump as known in the semiconductor industry. C4 bumps are known to have high temperature melting properties. For example, it is common for such structures to have a 90%, or greater, lead content by weight with the remaining 10%, or less, being tin. In such a composition, the melting point needed during a manufacturing process is in excess of 300° Centigrade. The actual process for forming BGAs with semiconductor devices attached is illustrated with reference to FIG. 2, and discussed in conjunction with the illustrations of FIG. 1.

FIG. 2 shows, in a flow diagram, a CBGA assembly process in accordance with the prior art. A prior art process 200 of FIG. 2 connects the semiconductor device 110 to the ceramic substrate 120. Next, a process 210 connects the resulting device of process 200 to BGA spheres. Process 200 comprises a step 201 for placing the semiconductor device in contact with the semiconductor substrate. As illustrated in FIG. 1, the semiconductor device 110 is placed in contact with the ceramic substrate 120 such that the bump solder structures 114 are aligned with the chip pads 122, and in contact with a flux 118. The semiconductor device is held in place by a small positive force generally on top of the substrate 112 which is not shown in FIG. 1. In addition, the flux 118, which was applied over the chip pads 122 of the ceramic substrate 120, provides a degree of adhesion. The purpose of the flux, as is well known in the art, is to reduce oxides and enhance "wettability" of the bump solder structures 114 to the chip pads 122. However, where C4 processes are being used, the flux 118 must have properties allowing its use in a high temperature environment.

Next, at step 202, the semiconductor device 110 and ceramic substrate 120 combination is applied to reflow step 202. During the reflow step 202, the semiconductor device 110 and ceramic substrate 120 are exposed to a high temperature furnace such that the solder bump structures 114 reflow to the chip pads 122 to form a semiconductor device 140 having a physical and electrical connection between the bumps 114 and the pads 122. The temperature needed to perform this reflow process is approximately 360° Centigrade to assure proper melting and reflowing of the solder bump structures 114.

Next, at step 204, a batch cleaning process is implemented. The batch reflow process requires that the devices from step 202 be removed from their carriers and placed in a carrier appropriate for the batch cleaning process. During the batch cleaning process 204, the residue flux 118 remaining from the reflow process 202 is removed. The cleaning step 204 not only removes contaminants which may remain, but cleans and prepares the bump solder structure surfaces for a subsequent underfill step to assure appropriate reliability. Due to safety and environmental requirements and regulations, the chemicals and solvents used in the cleaning process are often a low level flux dissolver or reactant, in that they react slowly to remove the residue remaining from step 202. As a result, the total amount time required to perform an effective cleaning of the structure 140 is increased to the point where it is a significant time factor in the processing of the semiconductor device 140.

Following the reflow and cleaning of the semiconductor device 140, an underfill is dispensed between the semiconductor substrate 112 and the ceramic portion 121, as shown at step 206. Next, at step 208, the underfill is cured 208 to provide additional support and reliability. This curing process is generally accomplished through a temperature cycle process. The dispensed underfill surrounds the resulting attached bump solder structures 144 and their associated interconnections with the chip pads 122. The underfill dispensed serves to provide enhanced reliability by eliminating environmental effects on the interconnections, as well providing mechanical support for the interconnections. However, while providing additional mechanical support, the underfill has a limitation in its use with low temperature solder bump structures 114.

When low temperature bump solder structures 114 are used, the underfill dispensed will prohibit further expansion of the solder bumps during further processing steps. The effects of expansion of low temperature structures 114 is more pronounced than those of high temperature structures. Solder expansions have been shown to cause reliability issues as a result of the hydrostatic forces of solder material between the underfill and the semiconductor substrate 112 interface, or the ceramic portion 121 and underfill interface.

The previously discussed steps 201 through 208, which form process 200, are performed in order to attach the semiconductor device 110 to the ceramic substrate 120, and require the use of a high temperature reflow of the solder bump structures 114. In addition, where low temperature eutectic materials are used, such as with a plating or screened process, a flow similar to 200 is used. Whether using a high temperature version of bump solder structures 114 or a low temperature version of solder bump structures 114, the process of FIG. 1 is substantially the same, and requires the same cleaning processes.

In order to complete the BGA package, BGA spheres 152 need to be attached to the underside of the ceramic structure pads 124. A sphere loading process takes place. During the sphere loading, the BGA spheres 152 are placed into a boat 150. The boat 150 acts as a holder for maintaining the BGA spheres at precise locations that align to the BGA pads 124. Next, screen printing is performed 212. During screen printing, a solder paste or joining material 154 is applied over the BGA spheres 152. The solder paste generally comprises a combination of solder, flux, and other elements to form a ready-to-use mixture. Next, the semiconductor device 140 is placed in contact with the boat 150, sphere 152, and paste 154 combination 214. Again, positive pressure is applied to the semiconductor device 140 to maintain appropriate contact with the boat 152 and BGA sphere combination. Next, a sphere attach low temperature reflow process is performed. The placed structure is reflowed, resulting in the semiconductor device 160. The solder paste 154 has been chosen to be a low temperature solder to interface the spheres 152 to the pads 124. The use of a low temperature reflow process allows the integrity of the spheres to be maintained. Assuring integrity of the spheres allows a uniform height across the BGA to be maintained, thus allowing for subsequent placement on printed circuit boards. Next, the spheres 152 are cleaned, 218, to assure integrity of connectivity later.

As discussed previously, in order to assure the integrity of the connections of semiconductor device 110, the ceramic substrate 120, and the resulting semiconductor device 140's attachment to the BGA spheres 152, a two processes (200 and 210) need to be performed. Both require duplicate placement equipment, reflow equipment, flux cleaning underfill dispense machinery. In addition to the equipment, there are costs associated with operation and facilities to be considered. Therefore, a CBGA process that would allow for lower manufacturing costs would be desirable.

BRIEF DESCRIPTION OF THE DRAWINGS

The features of the invention are set forth in the appended claims. However, the invention, as well as a preferred mode of use, and further advantages thereof, will best be understood by reference to the following detailed description of an illustrative embodiment when read in conjunction with the accompanying drawings, wherein:

FIG. 2 shows, in a flow diagram, a CBGA assembly process in accordance with the prior art.

FIG. 4 shows, in a flow diagram, a CBGA assembly process in accordance with a preferred embodiment of the present invention.

DETAILED DESCRIPTION OF THE PREFERRED EMBODIMENT

The present invention involves placing a semiconductor substrate having solder bump structures in contact with a ceramic substrate having chip pads, and placing this structure in contact with ball grid array spheres in order to form a placed sequence of structures into a CBGA in a single flow process.

Figure 1:
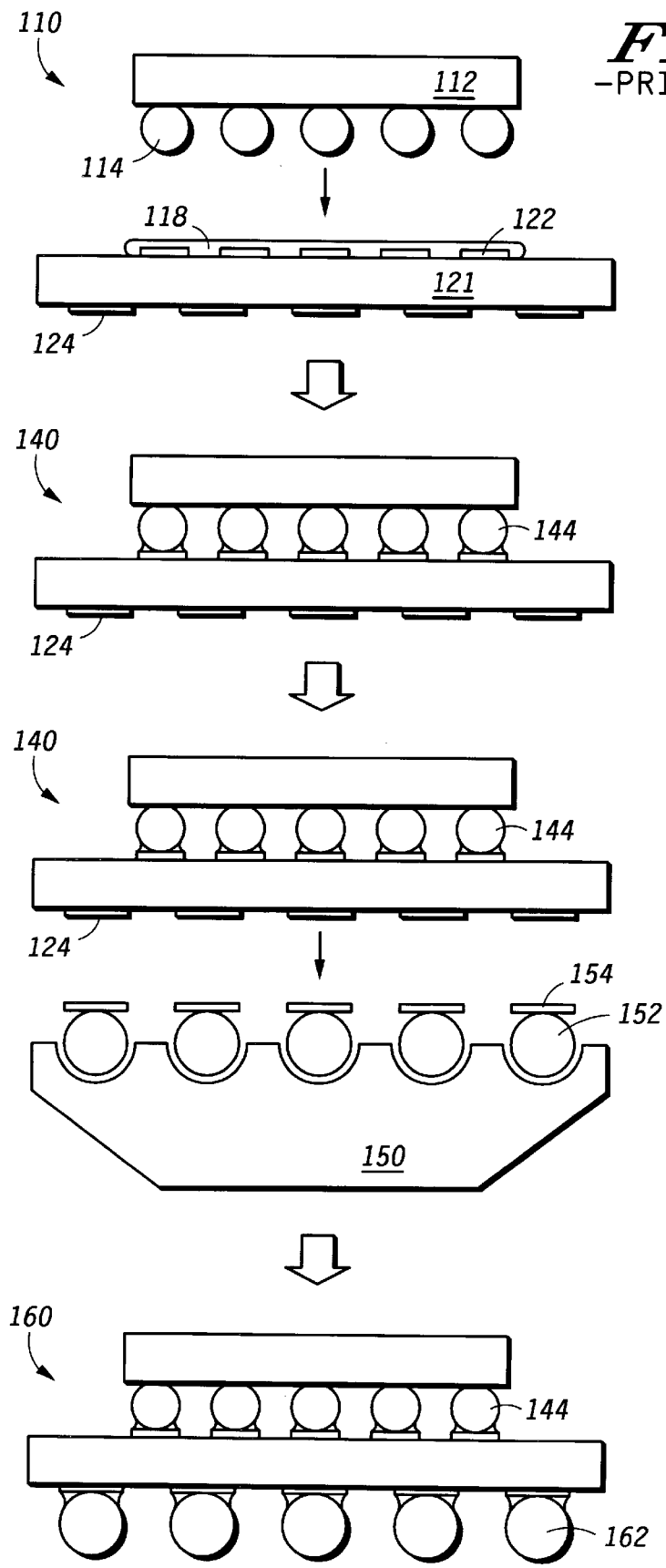
FIG. 1 illustrates assembly of a CBGA in accordance with the prior art.
Figure 3:
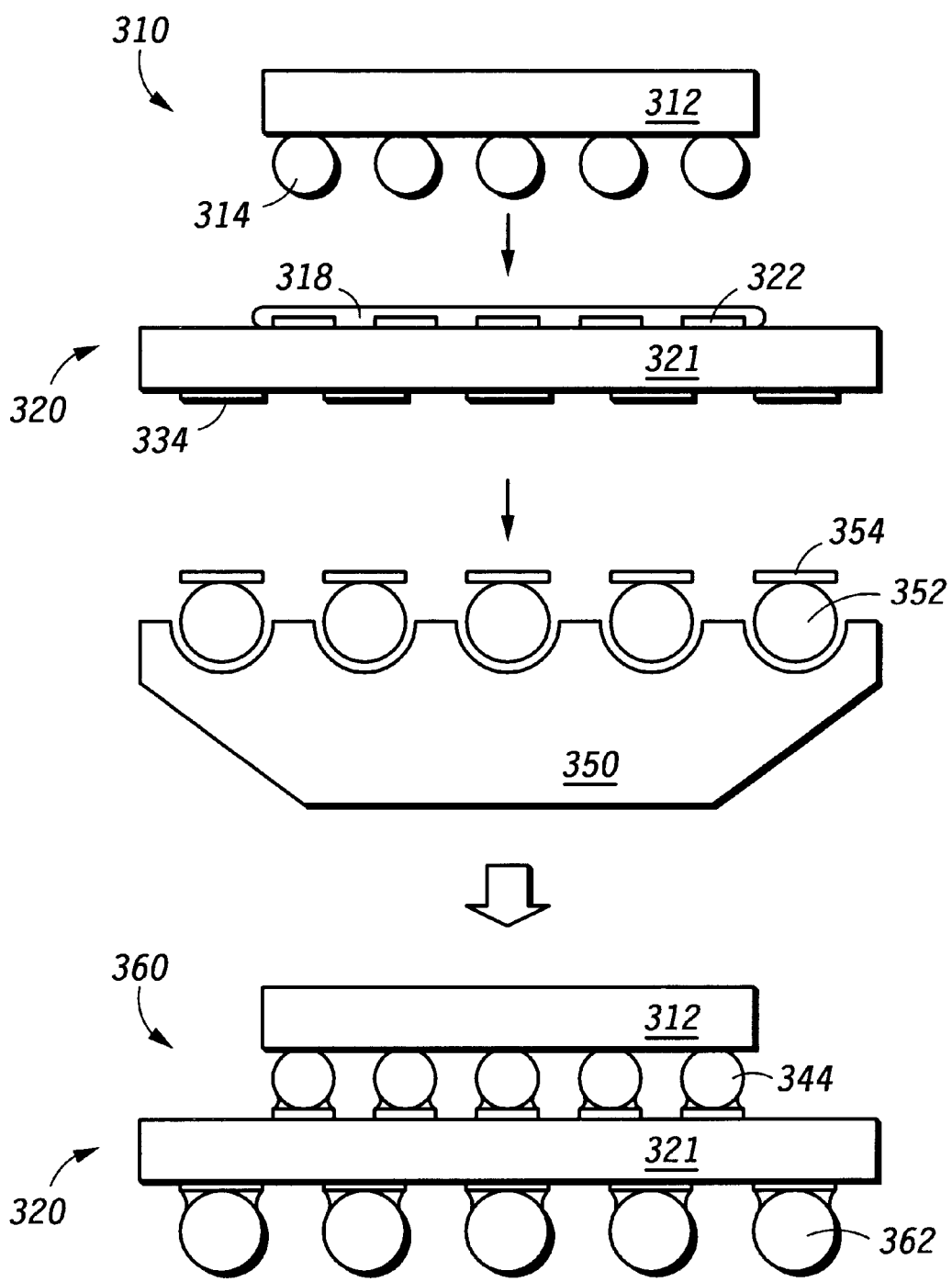
FIG. 3 illustrates assembly of a CBGA in accordance with a preferred embodiment of the present invention.

FIGS. 3 and 4 in combination show a process in accordance with a preferred embodiment of the present invention for creating a ceramic ball grid array BGA device. FIG. 3 illustrates assembly of a CBGA in accordance with a preferred embodiment of the present invention. FIG. 4 shows, in a flow diagram, a CBGA assembly process in accordance with a preferred embodiment of the present invention. Referring to FIGS. 3 and 4, a sphere loader 400 loads spheres 352 onto a boat 350. The boat 350 holds the spheres in an orientation to allow for alignment with BGA pads 334. In a preferred embodiment, the pads 334 are a nickel-gold alloy. Next, a conductive joining material (paste) 354 such as eutectic paste is applied 402 via a screen printer atop the ball grid array spheres 352. In another embodiment, the paste could be placed over the pads as well. The paste 354 is used to reduce oxidation and increase wetability of the spheres to the ball grid array pads. In general, interconnect structures such as the bump solder structure 314 and the BGA spheres 352 are not limited to a specific shape or material. For example, the interconnect structures' shape can be columnar or conical, as well as any other specific shape; likewise, the interconnect structures' materials can include tin-lead solders, or other types of conductive materials. In a preferred embodiment, the solder structure 314 will be conical.

Next, a die and substrate are placed 404 atop the boat and sphere structure. In a preferred embodiment, a ceramic substrate 320 having the ball grid array pads 334 and the chip pads 322 is placed in contact with eutectic paste 354. Atop the ceramic substrate chip pads 322, is placed a no-clean flux 318. In a preferred embodiment, the chip pads 322 are a nickel-gold alloy. The use of a no clean flux is different from the prior art, in that the prior art required using a traditional flux which left substantial residue requiring a further cleaning step in order to remove contaminants and prepare the surfaces involved for further processing steps. Specifically, the no-clean flux has properties which, in a preferred embodiment using low temperature reflow, allow for any residue remaining from the no-clean flux to be minimized to the extent it does not create reliability issues for the underfill process which follows. Then, a semiconductor substrate 312 having bump solder structures 314 is positioned 404 in contact with the no-clean flux and chip pads 322. The BGA spheres, the ceramic substrate, and the semiconductor substrate are thus aligned relative to the desired finished package structure positions.

The die and sphere combinations are reflowed with a reflow process 406. In a preferred embodiment, the reflow is a low temperature reflow process. During the reflow process of step 406, a temperature of approximately 220 ° Centigrade (C) is used in order to reflow at least a portion of the bump solder structures 314 such that it attaches to the chip pad 322 and, simultaneously, reflow paste 354 and a portion of spheres 352 such that they attach to BGA pads 334. In a preferred embodiment the reflow process would be a low temperature process, wherein the step of simultaneously reflowing the solder exposes the semiconductor device and the interconnect structures to only temperatures of less than 250° C. In a preferred embodiment, the bump solder structure 314 would be an E3 type structure such as that described in U.S. patent application Ser. No. 08/673/539, titled "Method for forming hardened bumps for a semiconductor device and device made thereby", filed Jul. 1, 1996, incorporated herein by reference. The advantage of an E3 type structure is that only the crown of the E3 structure actually forms an eutectic bond with the pad 322 such that a bump solder structure device is formed that will have minimal sensitivity to further temperature expansion during processing. In another embodiment, where an eutectic bump 314 is used, the connection is also formed during the low temperature reflow, but is not as advantageous as the E3 bump in that a purely eutectic bump is more sensitive to reliability concerns caused by expansion in further processing steps.

Next, at a step 408, a sphere cleaning step is performed in order to ready the ball grid array package for subsequent processing steps using the BGA package. The sphere cleaning step is performed in-line with the placing and reflow steps 400 through 406. This is an advantage over the prior art in that the batch clean step 204 is eliminated. Next, at a step 410, an underfill process is performed wherein an underfill material, such as a resin, is inserted between the semiconductor substrate 312, and the ceramic portion of the ceramic substrate 320. Next, at a step 412, a final underfill cure is performed. This forms a CBGA 360 having interconnect structures 344, 362.

By utilizing a semiconductor device 310 having bump solder structures, and in a preferred embodiment low temperature solder structures, placed in conjunction with not only the ceramic substrate 320, but also the BGA spheres 352, the reflow required to assembly the entire CBGA is performed in a single step, specifically a single pass reflow 406. Unlike the prior art, which requires the semiconductor device and ceramic substrate be reflowed at high temperature in a separate step, thereby requiring specific processing equipment, the CBGA of the present invention is assembled in a single pass reflow 406. Therefore, it can be seen that the present invention would reduce costs by eliminating the need for multiple placement devices and multiple reflow devices and reflow steps, as well as the need for multiple cleaning steps. For example, where the batch cleaning process step 204 of the prior art requires a significant amount of time in order to assure integrity of the surfaces between the semiconductor substrate and the ceramic substrate, the present invention eliminates this step entirely by using a no-clean flux as a result of the low temperature reflow process.

Figure 5:
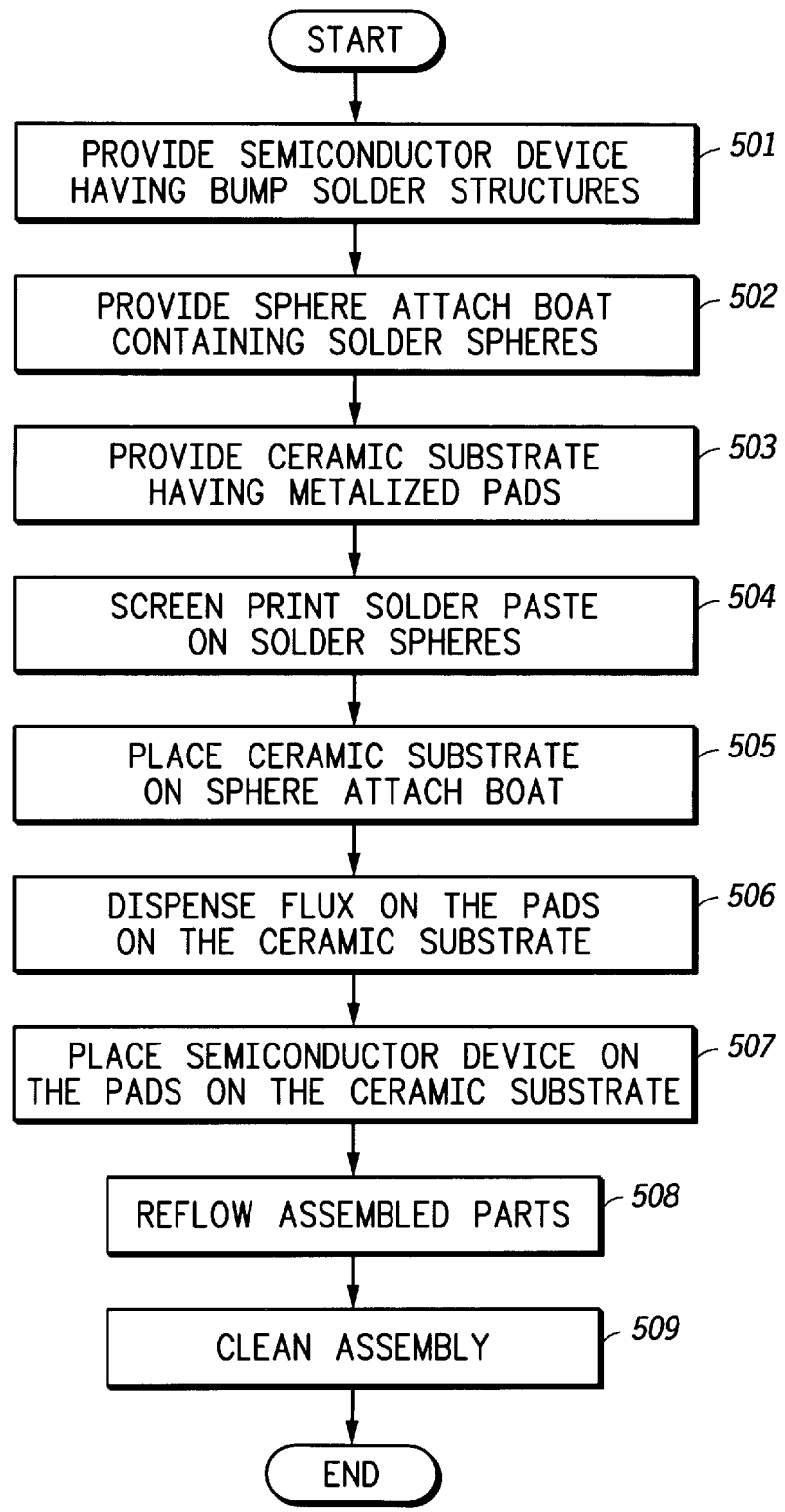
FIG. 5 depicts a flow chart of a method for implementing a CBGA process in accordance with a preferred embodiment of the present invention.

FIG. 5 is a flow chart of a method for implementing a CBGA process in accordance with a preferred embodiment of the present invention. FIG. 5 illustrates a specific flow 500 in accordance with a preferred embodiment of the present invention. As step 501, a semiconductor device having bump solder structures is provided. Next, at step 502, a sphere attach boat containing solder spheres is provided. Next, at step 503, a ceramic substrate having metallized pads is provided. Next, at step 504, a screen print of solder paste is applied on solder spheres. Next, at step 505, the ceramic substrate is placed on the sphere attach boat. Next, at step 506, flux is dispensed on the pads of the ceramic substrate. Next, at step 507, the semiconductor device is placed on the pads of the ceramic substrate. Next, at step 508, the assembled parts are simultaneously reflowed in a single-pass flow. Next, at step 509, the assembly is cleaned.

While the present invention has been discussed with respect to specific embodiments, it is understood that other specific embodiments exist. For example it is understood that the use of other structures besides ball grid array "spheres" could be used. In an alternative preferred embodiment, other types of solder aside from the specific tin lead solders discussed herein within the application. Specifically, in one preferred embodiment, paste 354 would be a high temperature paste or solder for connected a BGA sphere to the BGA pad, such that a single-pass high temperature reflow could be used with a C4 type semiconductor device to assembly a CBGA of the present invention with a single reflow step. While the invention has been described in the context of a preferred embodiment, it will be apparent to those skilled in the art that the present invention may be modified in numerous ways and may assume many embodiments other than that specifically set out and described above. Accordingly, it is intended that the appended claims cover all modifications of the invention which fall within the true spirit and scope of the invention.

What is claimed is:

1. A method of packaging an integrated circuit, the method comprising the steps of:
    providing a non-semiconductor substrate having a top side and a bottom side and having a first plurality of metallized pads on the top side and a second plurality of pads arranged in a first pattern on the bottom side;
    providing a semiconductor device with a first interconnect structure attached thereto;
    placing the first interconnect structure with the semiconductor device attached thereto in aligned contact with the first plurality of metallized pads;
    providing a boat for holding solder balls arranged in the first pattern;
    placing solder balls in the boat;
    aligning the solder balls with and contacting the solder balls to the second plurality of pads; and
    contemporaneously reflowing the first interconnect structure and the solder balls such that the semiconductor device and the solder balls are connected to the first and second plurality of metallized pads of the substrate.

2. A method according to claim 1, wherein the substrate is ceramic.

3. A method according to claim 1, wherein the first interconnect structure comprises low temperature materials.

4. A method according to claim 1, wherein the solder balls adhere at low reflow temperature.

5. A method according to claim 1, wherein the step of contemporaneously reflowing includes electrically connecting the semiconductor device and the solder balls to the first and second plurality of metallized pads.

6. A method according to claim 1, further comprising the step of depositing conductive joining material on a surface of the solder balls.

7. A method according to claim 6, wherein the conductive joining material is solder paste.

8. A method according to claim 7, wherein the step of depositing solder paste includes screen printing the solder paste.

9. A method according to claim 1, comprising the step of dispensing no-clean flux on one or more of the plurality of metallized pads.

10. A method according to claim 1, comprising the step of cleaning any flux from the integrated circuit package.

11. A method according to claim 1, wherein the first interconnect structure is an Evaporated, Extended Eutectic structure.

12. A method according to claim 1, wherein the first interconnect structure consists of lead and tin.

13. A method according to claim 1, wherein the first interconnect structure is formed by plating.

14. A method according to claim 1, wherein the first interconnect structure is formed by screen printing.

15. A method according to claim 1, further wherein the second interconnect structure is formulated as a high temperature solder.

16. A method according to claim 1, wherein the first and second plurality of metallized pads consist of gold and nickel.

17. A method according to claim 7, wherein the step of contemporaneously reflowing the solder paste exposes the semiconductor device and the second interconnect structure to temperatures of less than about 250° C.

18. A method of assembling an integrated circuit package, the method comprising the steps of:

providing a plurality of solder spheres;

providing a substrate having a plurality of metallized pads;

providing a semiconductor device having at least one low temperature solder structure comprising at least one solder bump;

providing a sphere attach boat containing the plurality of solder spheres;

placing the plurality of solder spheres in aligned contact with one or more of the plurality of metallized pads using the sphere attach boat;

placing the at least one low temperature solder structure in aligned contact with one or more of the plurality of metallized pads; and simultaneously reflowing the plurality of solder spheres and the at least one low temperature solder structure such that the semiconductor device and the plurality of solder spheres are connected to the plurality of metallized pads of the substrate.

19. A method according to claim 18, wherein the substrate is ceramic.

20. A method according to claim 18, further comprising the step of depositing low temperature solder paste on a surface of each of the plurality of solder spheres.

21. A method according to claim 18, further comprising the step of dispensing no-clean flux on one or more of the plurality of metallized pads.

22. A method according to claim 18, further comprising the step of cleaning any flux from the integrated circuit package.

23. A method according to claim 18, wherein at least one of the at least one low temperature solder structure is an Evaporated, Extended Eutectic structure.

24. A method according to claim 18, wherein at least one of the at least one low temperature solder structure consists of lead and tin.

25. A method according to claim 18, wherein at least one of the at least one low temperature solder structure is formed by plating.

26. A method according to claim 18, wherein at least one of the at least one low temperature solder structure is formed by screen printing.

27. A method according to claim 18, wherein the at least one solder sphere is formulated as a high temperature solder.

28. A method according to claim 18, wherein the metallized pads consist of gold and nickel.

29. A method according to claim 20, wherein the step of depositing low temperature solder paste includes screen printing the solder paste.

30. A method according to claim 18, wherein the step of simultaneously reflowing the low temperature solder structure exposes the semiconductor device and the at least one low temperature solder structure to only temperatures of less than 250° C.

31. A method of assembling a Ceramic Ball Grid Array (CBGA) integrated circuit package, the method comprising the steps of:

providing a semiconductor device having at least one low temperature solder structure connected to a surface of the semiconductor device;

providing a sphere attach boat containing at least one solder sphere;

providing a ceramic substrate having one or more metallized pads corresponding to a low temperature solder sphere and the at least one low temperature solder structure;

depositing low temperature solder paste on a top surface of the at least one solder sphere;

placing the one or more metallized pads in aligned contact with the corresponding at least one solder sphere;

placing the semiconductor device in aligned contact with the one or more metallized pads corresponding to the at least one low temperature solder structure; and simultaneously reflowing the low temperature solder paste and the at least one low temperature solder structure in a single pass reflow process such that the semiconductor device and at least one solder sphere are electrically and mechanically connected to the one or more metallized pads of the ceramic substrate.

32. A method according to claim 31, further comprising the step of dispensing no-clean flux on the metalized pads corresponding to the at least one low temperature solder structure.

33. A method according to claim 31, comprising the step of cleaning any flux from the CBGA integrated circuit package.

34. A method according to claim 31, wherein at least one of the at least one low temperature solder structure is an Evaporated, Extended Eutectic structure.

35. A method according to claim 31, wherein at least one of the at least one low temperature solder structure consists of lead and tin.

36. A method according to claim 31, wherein at least one of the at least one low temperature solder structure is formed by plating.

37. A method according to claim 31, wherein at least one of the at least one low temperature solder structure is formed by screen printing.

38. A method according to claim 31, wherein the at least one solder sphere is formulated as a high temperature solder.

39. A method according to claim 31, wherein the metallized pads consist of gold and nickel.

40. A method according to claim 31, wherein the step of depositing low temperature solder paste includes screen printing the low temperature solder paste.

41. A method according to claim 31, wherein the step of simultaneously reflowing the low temperature solder paste exposes the placed semiconductor device and the low temperature solder sphere to only temperatures of less than 250° C.

* * * * *